United States Patent
Choquet et al.

(10) Patent No.: US 10,641,456 B2
(45) Date of Patent: May 5, 2020

(54) LIGHTING MODULE FOR MOTOR VEHICLE PROJECTOR

(71) Applicant: VALEO VISION, Bobigny (FR)

(72) Inventors: Pierre Choquet, Bobigny (FR); Thomas Daniel, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 16/193,250

(22) Filed: Nov. 16, 2018

(65) Prior Publication Data
US 2019/0154226 A1 May 23, 2019

(30) Foreign Application Priority Data
Nov. 17, 2017 (FR) .................................. 17 60841

(51) Int. Cl.
| | |
|---|---|
| F21S 41/40 | (2018.01) |
| F21S 41/675 | (2018.01) |
| F21S 45/10 | (2018.01) |
| B81B 7/00 | (2006.01) |
| F21S 45/40 | (2018.01) |
| F21S 43/30 | (2018.01) |
| B60Q 1/068 | (2006.01) |
| G02B 26/08 | (2006.01) |
| F21S 45/47 | (2018.01) |
| G02B 5/00 | (2006.01) |

(52) U.S. Cl.
CPC .......... *F21S 41/675* (2018.01); *B60Q 1/068* (2013.01); *B81B 7/0067* (2013.01); *F21S 41/40* (2018.01); *F21S 43/30* (2018.01); *F21S 45/10* (2018.01); *F21S 45/40* (2018.01); *B60Q 2200/30* (2013.01); *F21S 45/47* (2018.01); *G02B 5/003* (2013.01); *G02B 26/0833* (2013.01)

(58) Field of Classification Search
CPC . F21S 10/40; F21S 45/40; F21S 45/30; B60Q 1/068
See application file for complete search history.

(56) References Cited

U.S. PATENT DOCUMENTS

| | | |
|---|---|---|
| 2004/0041988 A1 | 3/2004 | Kitamura |
| 2008/0158892 A1 | 7/2008 | Davis |
| 2009/0135564 A1 | 5/2009 | Chen et al. |

(Continued)

FOREIGN PATENT DOCUMENTS

| | | | | |
|---|---|---|---|---|
| EP | 3486211 A1 * | 5/2019 | ............. | B60Q 1/068 |
| WO | WO 2017/143372 A1 | 8/2017 | | |
| WO | WO 2017/147632 A1 | 9/2017 | | |

OTHER PUBLICATIONS

French Preliminary Search Report dated Aug. 1, 2018 in French Application 17 60841, filed on Nov. 17, 2017 (with English Translation of Categories of Cited Documents).

*Primary Examiner* — Anabel Ton
(74) *Attorney, Agent, or Firm* — Oblon, McClelland, Maier & Neustadt, L.L.P.

(57) ABSTRACT

Lighting module for a projector of a motor vehicle, the lighting module including a light source and a matrix of micromirrors, characterized in that it includes a mask disposed between the light source and the matrix of micromirrors, the mask including an opening allowing light rays coming from the light source to pass and oriented towards the matrix of micromirrors, and the mask including an opaque part blocking light rays coming from the light source and not oriented toward the matrix of micromirrors.

20 Claims, 4 Drawing Sheets

(56) References Cited

U.S. PATENT DOCUMENTS

| | | |
|---|---|---|
| 2015/0092435 A1 | 4/2015 | Yamamura et al. |
| 2015/0191115 A1* | 7/2015 | Yamamura ............ F21S 41/143 |
| | | 315/82 |
| 2018/0135824 A1* | 5/2018 | Mayer ................... F21S 41/657 |
| 2019/0202343 A1* | 7/2019 | Funk ...................... B60Q 1/085 |
| 2019/0368715 A1* | 12/2019 | Tsuda ..................... F21V 14/04 |

* cited by examiner

LIGHTING MODULE FOR MOTOR VEHICLE PROJECTOR

TECHNICAL FIELD OF THE INVENTION

The present invention concerns a lighting module for a projector of a motor vehicle, the lighting module comprising a matrix of micromirrors. The invention also concerns a projector for motor vehicles comprising a lighting module of this kind. The invention also concerns a motor vehicle comprising a projector of this kind or a lighting module of this kind.

PRIOR ART

For the lighting of motor vehicles, there is known the use of lighting modules comprising a light source and a matrix of micromirrors. A matrix of micromirrors is an electromechanical microsystem comprising a multitude of micromirrors that are all mobile about the same axis and can adopt at least two distinct orientations. According to its first orientation, a micromirror transmits a light ray out of the lighting module, in a lighting field. According to its second orientation, the light ray is deviated out of the lighting field and is absorbed by a structure of the lighting module. The orientation of each micromirror can be controlled individually by the effect of an electrostatic force. The lighting module comprises a control circuit connected to an electronic control unit. The electronic control unit sends a control current to each of the micromirrors to define its orientation thereof.

Such projectors enable composition and projection of complex images in front of the vehicle. They are therefore used to perform different functions such as for example the projection of information useful for the safety of pedestrians situated in the direct vicinity of the vehicle, or there again for example a function of lighting the road avoiding dazzling other motorists.

When it is operating, a lighting module of this kind may become strongly heated. Excessive heating can lead to a dysfunction, or even to destruction, of the matrix of micromirrors or of its control circuit. In order to cool the matrix of micromirrors, there is known the use of heatsinks and fans. However, these cooling means are bulky and of insufficient performance to maintain the lighting module below a damaging temperature.

OBJECT OF THE INVENTION

The object of the invention is to provide a lighting module remedying the above disadvantages and improving the known prior art lighting modules. In particular, the invention enables a lighting module to be produced that is compact, simple to use and limits the heating of the matrix of the micromirrors or of its control circuit.

The invention relates to a lighting module for a projector of a motor vehicle, the lighting module comprising a light source and a matrix of micromirrors, characterized in that it comprises a mask disposed between the light source and the matrix of micromirrors, the mask comprising an opening allowing light rays coming from the light source to pass and oriented towards the matrix of micromirrors, and the mask comprising an opaque part blocking light rays coming from the light source and not oriented toward the matrix of micromirrors.

The lighting module may comprise a microchip supporting the matrix of micromirrors, the microchip comprising an apparent surface positioned around the matrix of micromirrors and not intended to reflect light rays out of the lighting module, the opaque part of the mask blocking light rays coming from the light source and oriented toward the apparent surface.

The matrix of micromirrors extends in a first plane and in that the mask extends in a second plane, the first plane and the second plane being substantially parallel, the opening of the mask being positioned substantially in vertical alignment with the matrix of micromirrors.

The opening has a shape homothetic to a shape of the matrix of micromirrors.

The opening has a substantially rectangular shape, a width of the opening being between 4 mm and 10 mm inclusive, or even between 6 mm and 8 mm inclusive, and a length of the opening being between 5 mm and 15 mm inclusive, or even between 8 mm and 12 mm inclusive.

The area of the opening is greater than or equal to the area of the matrix of micromirrors, or even greater than or equal to twice the area of the matrix of micromirrors and/or in that the area of the opening is less than or equal to four times the area of the matrix of micromirrors, or even less than or equal to three times the area of the matrix of micromirror.

The lighting module may comprise a light collimator disposed between the light source and the mask, a light beam coming from the collimator illuminating the opening of the mask.

The micromirrors are individually mobile between an active orientation and an inactive orientation, the micromirrors reflecting light rays coming from the light source through the opening of the mask when they are in their active orientation, the micromirrors reflecting light rays coming from the light source against the opaque part of the mask when they are in their inactive orientation.

The opaque part of the mask includes an overthickness, the micromirrors reflecting light rays coming from the light source against said overthickness when they are in their inactive orientation.

The lighting module may comprise at least one heat dissipation means, notably a fan and/or a heatsink.

The mask supports a heat dissipation means, notably a fan and/or a heatsink.

The invention also relates to a projector comprising a lighting module as defined above.

The invention also relates to a motor vehicle comprising a lighting module as defined above or a projector as defined above.

BRIEF DESCRIPTION OF THE DRAWINGS

These objects, features and advantages of the present invention will be described in detail in the following description of one particular embodiment given by way of nonlimiting example with reference to the appended figures in which.

DESCRIPTION OF PREFERRED EMBODIMENTS OF THE INVENTION

Figure 1:
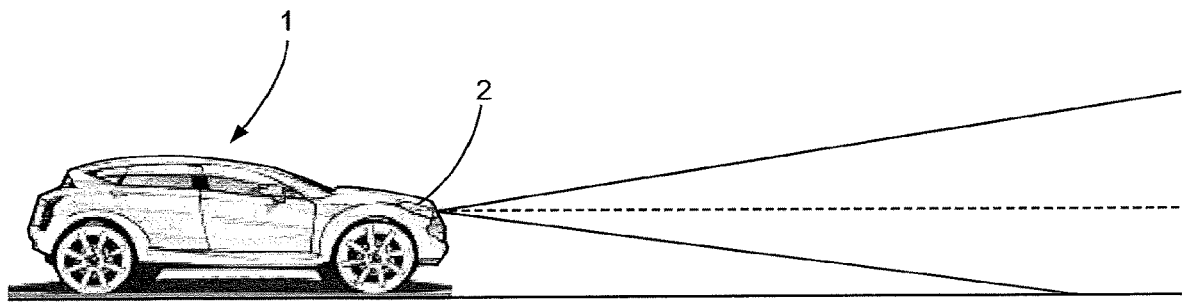
FIG. 1 is a diagrammatic view of a motor vehicle according to one embodiment of the invention.

FIG. 1 illustrates a motor vehicle 1 including a projector 2 according to one embodiment of the invention. The vehicle may be of any kind, for example it may be a private vehicle, a utility vehicle or a truck. The projector 2 is disposed at the front of the vehicle but could equally well equip the rear of the vehicle. The projector enables lighting of the road, to be seen by other motorists and/or to project onto the ground images providing information to the driver or to their environment.

Figure 2:
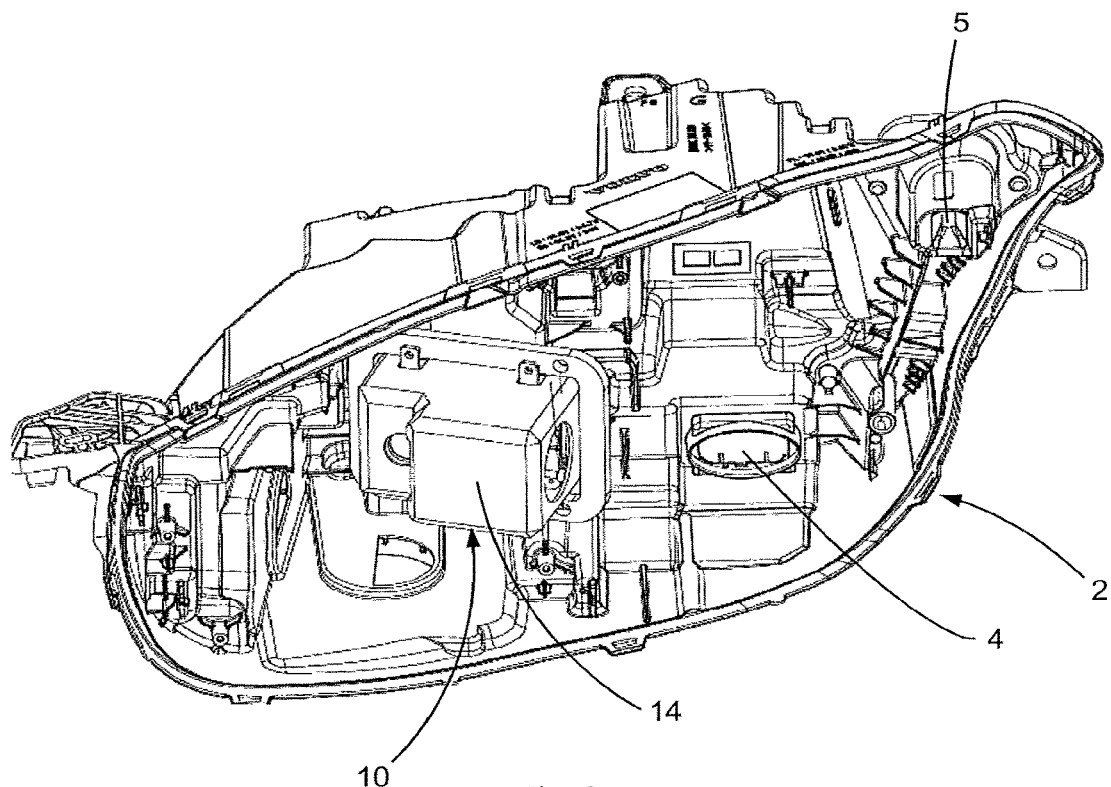
FIG. 2 is an isometric view of a projector according to one embodiment of the invention.

FIG. 2 illustrates the projector 2. The projector 2 comprises a casing 3 containing a lighting module 10 including a matrix of micromirrors 21 and holes 4, 5 for other luminous devices. The lighting module 10 may perform different lighting functions of the projector such as for example produce a running light, a dipped beam, a high beam, a fog light or an indicator.

Figure 3:
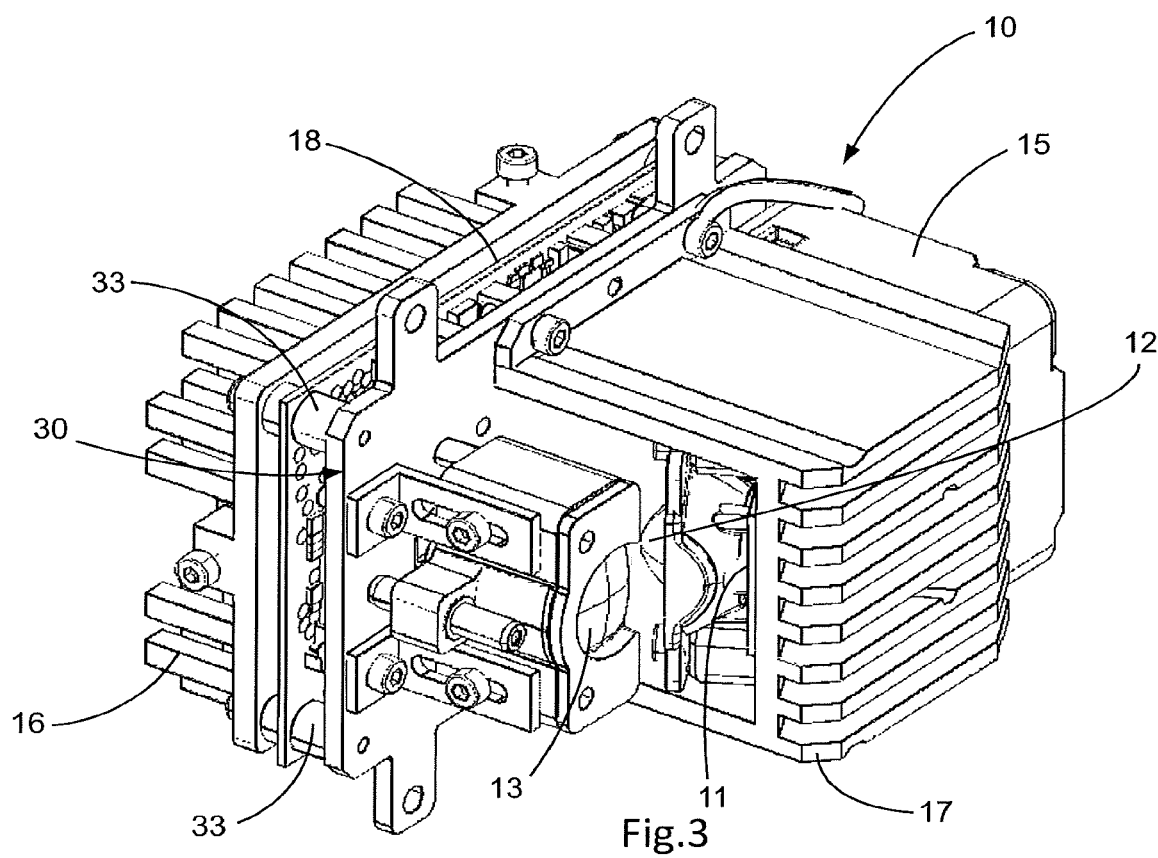
FIG. 3 is a first partial isometric view of a lighting module including a matrix of micromirrors.
Figure 4:
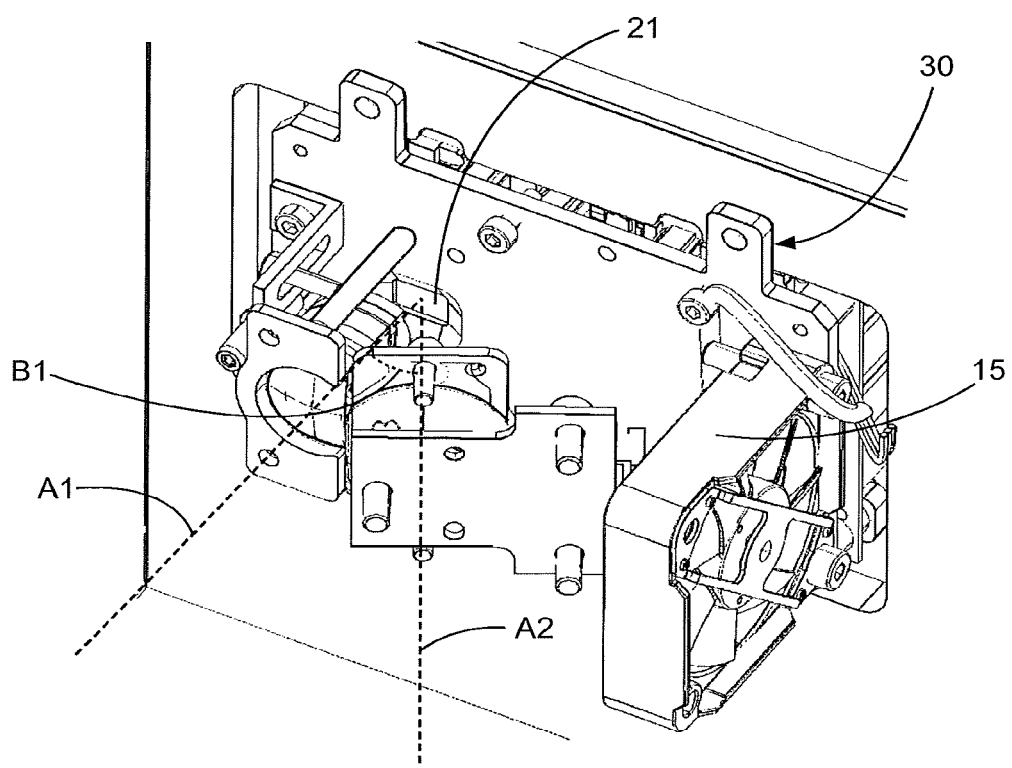
FIG. 4 is a second partial isometric view of the lighting module.

FIGS. 3 and 4 show more precisely the lighting module 10 including the matrix of micromirrors 21. The lighting module 10 comprises a light source 11, in this instance a light-emitting diode, a collimator 12 and an optical projection system 13. The light source 11 and the collimator 12 are arranged so that light rays coming from the light source pass through the collimator 12 and are then directed toward the matrix of micromirrors 21. The light rays can then be reflected by the matrix of micromirrors 21 and pass through the optical projection system 13. The collimator 12 and the optical projection system 13 may comprise one or more optical lenses. A protection casing 14, visible only in FIG. 2, can be fixed to the lighting module to protect it. This protection casing is open at the level of the optical projection system 13 to allow the light rays to exit.

As represented in FIG. 4, there may be defined a first optical axis A1 passing through the centre of the optical projection system 13, that is to say passing through the centre of the optical lens or lenses constituting it. Similarly, there may be defined a second optical axis A2 passing through the centre of the collimator, that is to say passing through the centre of the optical lens or lenses that constitute it. The first optical axis A1 and the second optical axis A2 define the path of a light ray passing through the centre of the collimator and through the centre of the optical projection system 13. The angle B1 formed between the axis A1 and the axis A2 may be approximately equal to 24° or to any other value allowing adequate arrangement of the collimator and of the optical projection system in the lighting module.

Moreover, the lighting module 10 comprises heat dissipation means. These heat dissipation means are notably a fan 15, a first heatsink 16 positioned in a rear part of the lighting module, opposite the optical projection system 13 and the collimator 12, and a second heatsink 17 positioned around the collimator 12.

Figure 6:
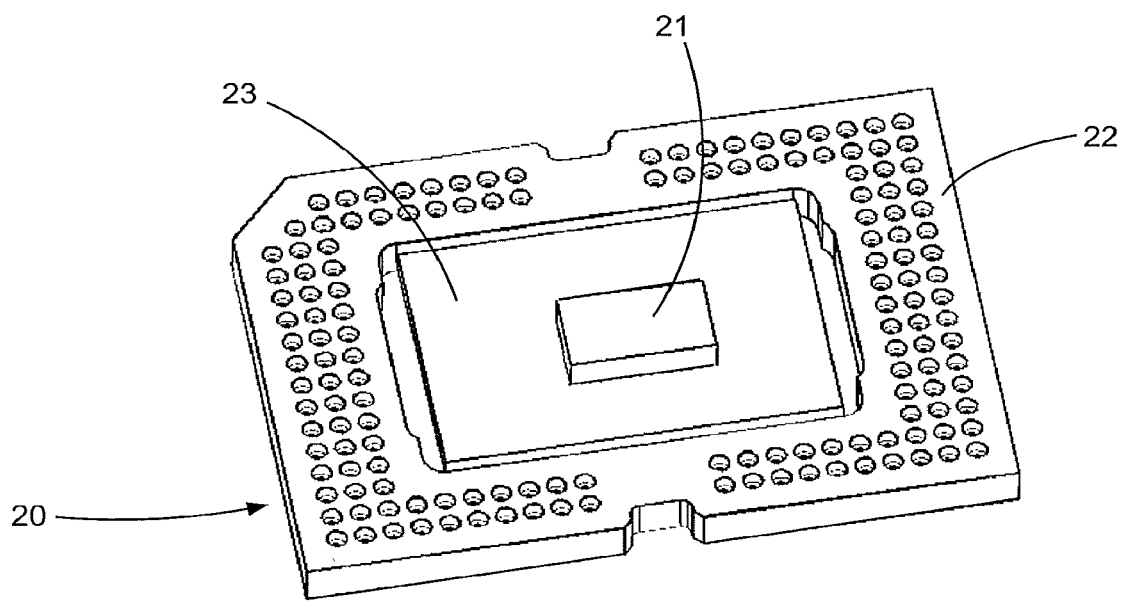
FIG. 6 is a view of a microchip comprising a matrix of micromirrors.

The matrix of micromirrors 21 is an electromechanical microsystem comprising a multitude of flat micromirrors that are all mobile independently about the same axis. The micromirrors can adopt two distinct orientations of 24°. The orientation of each micromirror can be controlled individually by the effect of an electrostatic force. Each micromirror may be of square shape with a side length of approximately 7 µm. The micromirrors may be spaced approximately 0.5 µm from one another. The matrix of micromirrors has a rectangular shape with a width of approximately 3.5 mm and a length of approximately 7 mm and can comprise several hundred micromirrors across the width and several hundred micromirrors across the length. The matrix of micromirrors 21 is integrated into a larger microchip 20 illustrated in FIG. 6. The microchip 20 also has a rectangular shape and can have a width of approximately 22 mm and a length of approximately 32 mm. The microchip comprises the matrix of micromirrors at its centre and a connection interface 22 on an exterior perimeter. An apparent surface 23 extends between the matrix of micromirrors 21 and the connection interface 22. Only the matrix of micromirrors 21 is intended to reflect the light coming from the light source. The apparent surface 23 does not comprise micromirrors. The microchip 20 and in particular the matrix of micromirrors are particularly sensitive to temperature. To guarantee correct operation, the temperature of the microchip and of the matrix of micromirrors must not exceed a threshold temperature, for example a temperature of 68° C.

According to a first, so-called active, orientation, a micromirror reflects a light ray coming from the light source 11 towards the optical projection system 13. That is to say the light ray passes through the optical projection system 13 and emerges from the projector to light the road or the environment of the vehicle. According to a second, so-called inactive, orientation, a micromirror reflects a light ray coming from the light source 11 elsewhere than toward the optical projection system 13. That is to say the light ray does not pass through the optical projection system 13 and is not used for a lighting function.

The lighting module also comprises a printed circuit 18 to which is fixed a microchip 20 supporting the matrix of micromirrors 21. The printed circuit, the microchip and the matrix of micromirrors extend in planes parallel to one another and perpendicular to the first optical axis A1. The printed circuit 18 comprises electronic pilots enabling control of the matrix of micromirrors. The electronic control unit sends a command defining which micromirrors are oriented according to the first orientation and which micromirrors are oriented according to the second orientation. The command is sent to the matrix of micromirrors via the printed circuit and the microchip. Thus each micromirror defines one pixel of a complex image: the matrix of micromirrors can therefore be used not only to obtain a standard lighting but also to project complex images.

The lighting module comprises a mask 30 disposed between the light source and the matrix of micromirrors. According to the embodiment shown, the mask is even disposed between the collimator 12 and the matrix of micromirrors 21. The mask comprises an opening 31 allowing light rays coming from the light source and oriented toward the matrix of micromirrors to pass. The mask comprises an opaque part 32 blocking light rays coming from the light source and not oriented toward the matrix of micromirrors, that is to say oriented elsewhere than toward the matrix of micromirrors. By "blocking" is meant that the light rays can be absorbed or reflected by the opaque part. A light ray oriented toward the printed circuit 18 or toward the microchip 20 around the matrix of micromirrors, in particular toward the apparent surface 23, would therefore be blocked by the opaque part 32 of the mask. The trajectory of a light ray reflected by the mask does not encounter either the matrix of micromirrors or the microchip to which the matrix of micromirrors is fixed, nor the printed circuit to which the microchip is fixed. The light rays reflected by the mask preferably do not penetrate into the optical projection system 13 but are directed toward a non-functional zone of the lighting module where they will finally be absorbed. Alternatively the opaque part could be translucent or transparent and deflect (rather than block) the light rays so that the latter do not strike either the matrix of micromirrors, or the microchip, or the printed circuit.

Figure 5:
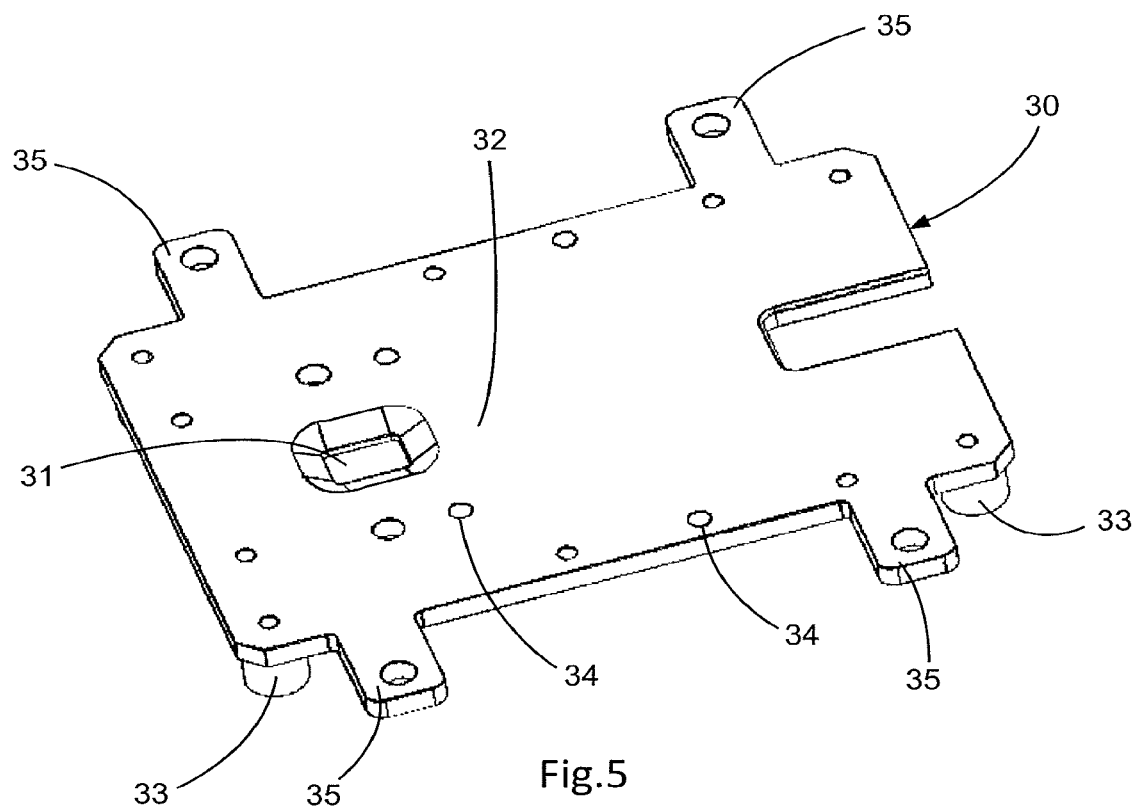
FIG. 5 is an isometric view of a mask according to one embodiment of the invention.

The mask 30, particularly visible in FIGS. 3 and 5, extends in a plane substantially parallel to the plane of the matrix of micromirrors, of the microchip and of the printed circuit. The mask may be a plate of globally rectangular shape of similar size to the printed circuit. A length of the mask may for example be of the order of 100 mm and a width of the mask may be of the order 65 mm. The opening 31 of the mask is also of rectangular shape and has a length of the order of 10 mm and a width of the order of 7 mm. The ratio of the area of the opening 31 to the area of the matrix of micromirrors 21 is therefore approximately 2.8 or 2.9. The opening 31 is larger than the matrix of micromirrors 21 but smaller than the microchip 20. The opening of the mask is positioned substantially in vertical alignment with the matrix of micromirrors, on the trajectory of the light rays coming from the collimator 12 and directed toward the matrix of micromirrors. The size of the opening is sufficient for on the one hand all of the matrix of micromirrors to be illuminated by the light source and on the other hand for all the light rays reflected by micromirrors in the active orientation to be able to exit via this same opening 31.

The light beam at the exit of the collimator has a substantially circular section until it reaches the opening 31. The collimator is advantageously designed so that the circular section of the light beam at the level of the mask corresponds to a circle circumscribed on the rectangle of the opening 31. Beyond the opening 31 the light beam has a rectangular section. The mask therefore has a function of shaping the light beam. The image projected by the lighting module has a rectangular shape and its proportions are substantially identical to those of the matrix of micromirrors.

The opening 31 advantageously has a shape homothetic to that of the matrix of micromirrors 21. That is to say the rectangle traced by the opening 31 and the rectangle traced by the matrix of micromirrors 21 are oriented in the same manner and have substantially identical proportions. Assuming that the matrix of micromirrors had a different shape, for example circular or polygonal, the shape of the opening would therefore be adapted accordingly. The angle B1 defining an angle of incidence of the light rays on the mask can advantageously be taken into account to adapt the proportions of the opening of the mask. Thus the opening 31 of the mask is defined so that the light beam downstream of that opening (that is to say beyond that opening) illuminates the whole and only the whole of the matrix of micromirrors 21. In order to take account of the geometrical tolerances of the lighting module, the light beam could illuminate an area slightly greater than that of the matrix of micromirrors.

The mask 30 is fixed against the printed circuit by means of spacers 33 enabling a regular spacing to be defined between the printed circuit and the mask. The space between the mask and the printed circuit may be between 5 mm and 10 mm inclusive. The mask also serves as a support for fixing the optical projection system 13, the collimator 12, the segment heatsink 19 and the fan 17. To this end, the mask comprises different fixing holes 34 through which pass fixing screws for the optical projection system 13, the collimator 12 and the second heatsink 19. These fixing holes 34 are distinguished from said opening in that they are not intended to allow light to pass through but rather fixing screws. The mask also comprises appendices 35 enabling the casing 14 and the whole of the lighting module 10 to be fixed into the projector 2.

On the one hand, the micromirrors reflect the light rays coming from the light source through the opening of the mask when they are in their active orientation. On the other hand, the micromirrors reflect the light rays coming from the light source against the opaque part of the mask when they are in their inactive orientation. The light rays are either absorbed by the mask or reflected by the mask and therefore confined in the space separating the mask from the printed circuit. In the vicinity of the opening, the mask may comprise an overthickness 36 represented diagrammatically in FIGS. 7 and 8. The overthickness 36 is positioned on the trajectory of the light rays when they are reflected by micromirrors in the inactive orientation. The mask may be made of plastic or of aluminium for example so as to conduct heat toward the heat dissipating means. The mask 30 is therefore liable to become heated but it is also effectively cooled because the fan 15 and the second heatsink 17 are fixed directly against the mask. Moreover, the mask is made from a temperature-resistant material and/or one having good heat conduction properties. The spacers 33 enable the hot mask to be maintained at a controlled distance from the microchip 20 and from the printed circuit 18.

Figure 7:
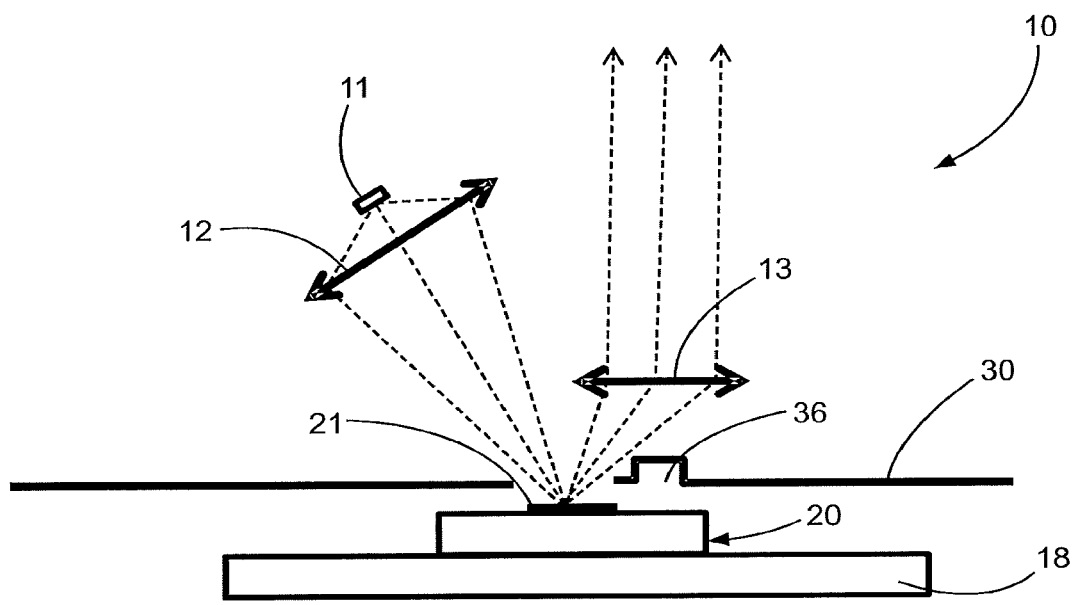
FIG. 7 is a diagrammatic view of the lighting module, micromirrors being in an active orientation.

FIG. 7 illustrates the operation of the lighting module. The light source emits a light ray that passes through the collimator (schematically represented by a single optical lens in FIG. 7). The light ray then passes through the opening and is reflected by at least one micromirror in the active orientation. The light ray passes back through the opening and enters the optical system (schematically represented by a single optical lens in FIG. 7). The light ray exits the optical system substantially parallel to the first optical axis A1.

Figure 8:
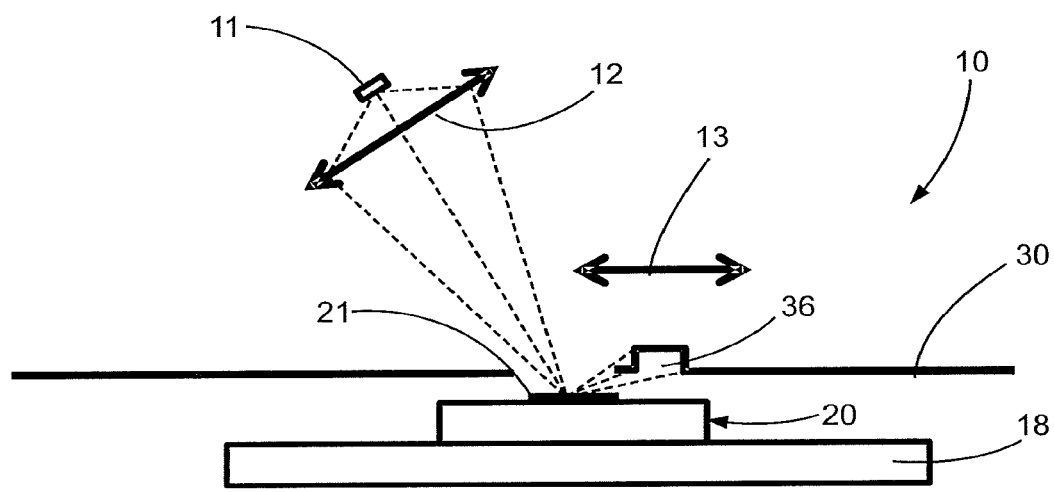
FIG. 8 is a diagrammatic view of the lighting module, micromirrors being in an inactive orientation.

FIG. 8 illustrates the operation of the lighting module. The light source emits a light ray that passes through the collimator (schematically represented by a single optical lens in FIG. 7). The light ray then passes through the opening and is reflected by a micromirror in the active orientation. The light ray encounters the optical part of the mask, notably the overthickness 36. The light ray is absorbed by the mask and is converted into heat. The heat is evacuated from the mask by means of the heat dissipating means, notably the fan 15 and the heatsink 17.

Operation of the lighting module with some of the micromirrors in the active orientation and the other micromirrors in the inactive orientation is naturally possible.

Thanks to the invention, the mask fulfils a plurality of functions: first of all, it prevents light coming from a light source from uselessly heating the matrix of micromirrors and/or the microchip and allows only the useful light rays to pass, that is to say those which impact on the matrix of micromirrors. The microchip 20 and the printed circuit 18 do not absorb any or only a few light rays, which minimizes the heating thereof. The mask also enables blocking of the light rays reflected by the micromirrors in the inactive orientation. Finally, the mask evacuates heat produced by absorption of light rays at a distance from the matrix of micromirrors and forms a support for fastening together various essential components of the lighting module. The temperature of the microchip and/or of the matrix of microcircuits can therefore be lowered by 10° C. to 30° C. compared to an identical lighting module with no mask.

The invention claimed is:

1. A lighting module for a projector of a motor vehicle, the lighting module comprising:
   a light source;

a matrix of micromirrors; and a mask disposed between the light source and the matrix of micromirrors, the mask comprising an opening allowing light rays coming from the light source to pass and oriented towards the matrix of micromirrors, and the mask comprising an opaque part blocking light rays coming from the light source and not oriented toward the matrix of micromirrors.

2. The lighting module according to claim 1, wherein the lighting module comprises a microchip supporting the matrix of micromirrors, the microchip comprising an apparent surface positioned around the matrix of micromirrors and not intended to reflect light rays out of the lighting module, the opaque part of the mask blocking light rays coming from the light source and oriented toward the apparent surface.

3. The lighting module according to claim 1, wherein the matrix of micromirrors extends in a first plane and the mask extends in a second plane, the first plane and the second plane being substantially parallel, the opening of the mask being positioned substantially in vertical alignment with the matrix of micromirrors.

4. The lighting module according to claim 1, wherein the opening has a shape homothetic to a shape of the matrix of micromirrors.

5. The lighting module according to claim 1, wherein the opening has a substantially rectangular shape, a width of the opening being between 4 mm and 10 mm inclusive, and a length of the opening being between 5 mm and 15 mm inclusive.

6. The lighting module according to claim 1, wherein an area of the opening is greater than or equal to an area of the matrix of micromirrors, and the area of the opening is less than or equal to four times the area of the matrix of micromirrors.

7. The lighting module according to claim 1, wherein the lighting module comprises a light collimator disposed between the light source and the mask, a light beam coming from the collimator illuminating the opening of the mask.

8. The lighting module according to claim 1, wherein the micromirrors are individually mobile between an active orientation and an inactive orientation, the micromirrors reflecting light rays coming from the light source through the opening of the mask when the micromirrors are in the active orientation, the micromirrors reflecting light rays coming from the light source against the opaque part of the mask when the micromirrors are in the inactive orientation.

9. The lighting module according to claim 8, wherein the opaque part of the mask includes an overthickness, the micromirrors reflecting light rays coming from the light source against said overthickness when the micromirrors are in the inactive orientation.

10. The lighting module according to claim 1, wherein the lighting module comprises at least one heat dissipation means.

11. The lighting module according to claim 10, wherein the mask supports the at least one heat dissipation means.

12. A projector comprising a lighting module according to claim 1.

13. A motor vehicle, wherein the motor vehicle comprises a lighting module according to claim 1.

14. A motor vehicle, wherein the motor vehicle comprises a projector according to claim 12.

15. The lighting module according to claim 2, wherein the matrix of micromirrors extends in a first plane and in that the mask extends in a second plane, the first plane and the second plane being substantially parallel, the opening of the mask being positioned substantially in vertical alignment with the matrix of micromirrors.

16. The lighting module according to claim 2, wherein the opening has a shape homothetic to a shape of the matrix of micromirrors.

17. The lighting module according to claim 2, wherein the opening has a substantially rectangular shape, a width of the opening being between 4 mm and 10 mm inclusive, and a length of the opening being between 5 mm and 15 mm inclusive.

18. The lighting module according to claim 2, wherein an area of the opening is greater than or equal to an area of the matrix of micromirrors, and the area of the opening is less than or equal to four times the area of the matrix of micromirrors.

19. The lighting module according to claim 2, wherein the lighting module comprises a light collimator disposed between the light source and the mask, a light beam coming from the collimator illuminating the opening of the mask.

20. The lighting module according to claim 2, wherein the micromirrors are individually mobile between an active orientation and an inactive orientation, the micromirrors reflecting light rays coming from the light source through the opening of the mask when the micromirrors are in the active orientation, the micromirrors reflecting light rays coming from the light source against the opaque part of the mask when the micromirrors are in the inactive orientation.

* * * * *